(12) United States Patent
Tomida (10) Patent No.: US 12,015,072 B2
(45) Date of Patent: Jun. 18, 2024

(54) SEMICONDUCTOR DEVICE INCLUDING CATION SPECIES, MANUFACTURING METHOD THEREOF, AND ELECTRONIC EQUIPMENT

(71) Applicant: SONY SEMICONDUCTOR SOLUTIONS CORPORATION, Kanagawa (JP)

(72) Inventor: Kazuyuki Tomida, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 340 days.

(21) Appl. No.: 17/299,694

(22) PCT Filed: Nov. 29, 2019

(86) PCT No.: PCT/JP2019/046711
§ 371 (c)(1),
(2) Date: Jun. 3, 2021

(87) PCT Pub. No.: WO2020/129571
PCT Pub. Date: Jun. 25, 2020

(65) Prior Publication Data
US 2022/0059669 A1    Feb. 24, 2022

(30) Foreign Application Priority Data

Dec. 20, 2018  (JP) ................. 2018-238158

(51) Int. Cl.
*H01L 29/51*    (2006.01)
*H01L 21/28*    (2006.01)
(Continued)

(52) U.S. Cl.
CPC .......... *H01L 29/516* (2013.01); *H01L 27/092* (2013.01); *H01L 29/40111* (2019.08); *H01L 29/78391* (2014.09); *H01L 29/785* (2013.01)

(58) Field of Classification Search
CPC ............ H01L 29/516; H01L 29/78391; H01L 29/40111; H01L 27/092; H01L 29/785
(Continued)

(56) References Cited

U.S. PATENT DOCUMENTS 8,659,000 B2 *   2/2014  Ikarashi ............. G11C 13/0004
                                                    257/4
2003/0218223 A1 * 11/2003  Nishiyama ......... H01L 29/6659
                                                    257/E21.345
(Continued)

FOREIGN PATENT DOCUMENTS

JP    2003-249649    9/2003
JP    2007-208160    8/2007
(Continued)

OTHER PUBLICATIONS

International Search Report prepared by the Japan Patent Office dated Feb. 7, 2020, for International Application No. PCT/JP2019/046711.

(Continued)

*Primary Examiner* — Jami Valentine Miller
(74) *Attorney, Agent, or Firm* — Sheridan Ross PC (57) ABSTRACT

There is provided a semiconductor device including a channel portion, and a gate electrode provided on a side opposite to the channel portion with a gate insulating film interposed between the gate electrode and the channel portion, in which the gate insulating film incudes a first portion having a first transition metal oxide, and a second portion having a second transition metal oxide and cation species and having a concentration of the cation species different from the first portion.

20 Claims, 9 Drawing Sheets

(51) Int. Cl.
  *H01L 27/092*   (2006.01)
  *H01L 29/78*    (2006.01)
(58) Field of Classification Search
  USPC .......................................... 257/295
  See application file for complete search history.

(56) References Cited

U.S. PATENT DOCUMENTS

| | | |
|---|---|---|
| 2008/0083956 A1 | 4/2008 | Mise et al. |
| 2013/0056804 A1 | 3/2013 | Moriyama |
| 2013/0175513 A1* | 7/2013 | Ford ................. C08G 73/0266 |
| | | 257/40 |
| 2015/0187771 A1 | 7/2015 | Niimi et al. |
| 2018/0182977 A1* | 6/2018 | Hirose ................ H10K 50/115 |
| 2019/0372449 A1* | 12/2019 | Mills .......................... C01B 3/00 |
| 2020/0219986 A1* | 7/2020 | Then .................... H01L 29/408 |

FOREIGN PATENT DOCUMENTS

| | | |
|---|---|---|
| JP | 2017-505535 | 2/2017 |
| KR | 10-2016-0086737 | 7/2016 |
| WO | WO 2010/050291 | 5/2010 |
| WO | WO 2012/017506 | 2/2012 |

OTHER PUBLICATIONS

Official Action (with English translation) for Korea Patent Application No. 10-2021-7018101, dated Mar. 26, 2024, 11 pages.

* cited by examiner

SEMICONDUCTOR DEVICE INCLUDING CATION SPECIES, MANUFACTURING METHOD THEREOF, AND ELECTRONIC EQUIPMENT

CROSS REFERENCE TO RELATED APPLICATIONS

This application is a national stage application under 35 U.S.C. 371 and claims the benefit of PCT Application No. PCT/JP2019/046711 having an international filing date of 29 Nov. 2019, which designated the United States, which PCT application claimed the benefit of Japanese Patent Application No. 2018-238158 filed 20 Dec. 2018, the entire disclosures of each of which are incorporated herein by reference.

TECHNICAL FIELD

The present disclosure relates to a semiconductor device, a manufacturing method thereof, and electronic equipment.

BACKGROUND ART

A metal-oxide film (insulating film)-semiconductor field effect transistor (metal-oxide (insulator)-semiconductor field effect transistor) (MOSFET or MISFET, referred to as a MOSFET as a representative, hereinafter) is a fundamental element of a semiconductor device.

In recent years, miniaturization of a MOSFET has been advanced more and more, as miniaturization and higher integration of a semiconductor device are proceeding. Accordingly, an attempt is made for a gate insulating film in the MOSFET to further increase a relative permittivity and change a dielectric property thereof. For example, changes of material species, doping of an additive, change in crystal structure, and the like, in the gate insulating film have been examined (WO10/050291). Application of such dielectric films to devices such as a ferroelectric memory, a negative capacitance FET, and the like, has been expected.

CITATION LIST

Patent Literature

[PTL 1]
WO10/050291

SUMMARY

Technical Problems

However, a dielectric film obtained by an atomic layer deposition (ALD) method or the like has an additive such as cation species contained in the whole surface of a device. Accordingly, such a dielectric film described above may contain cation species in an undesirable region for device configuration, and as a result, desirable device characteristics may not be obtained, in some cases.

Solution to Problems

According to the present disclosure, there is provided a semiconductor device including a channel portion, and a gate electrode provided on a side opposite to the channel portion with a gate insulating film interposed between the gate electrode and the channel portion, in which the gate insulating film incudes a first portion having a first transition metal oxide, and a second portion having a second transition metal oxide and cation species and having a concentration of the cation species different from the first portion.

In addition, according to the present disclosure, there is provided a manufacturing method of a semiconductor device, including forming a channel portion, and forming a gate electrode provided on a side opposite to the channel portion with a gate insulating film interposed therebetween, in which the gate insulating film is formed so as to include a first portion having a first transition metal oxide, and a second portion having a second transition metal oxide and cation species and having a concentration of the cation species different from the first portion.

Moreover, according to the present disclosure, there is provided electronic equipment including a channel portion, and a gate electrode provided on a side opposite to the channel portion with a gate insulating film interposed therebetween, in which the gate insulating film incudes a first portion having a first transition metal oxide, and a second portion having a second transition metal oxide and cation species and having a concentration of the cation species different from the first portion.

DESCRIPTION OF EMBODIMENTS

Hereinafter, preferred embodiments of the present disclosure will be described in detail with reference to the attached drawings. Note that, in the present specification and the drawings, the same reference signs are provided to constituent elements with substantially the same functional configurations, and the description will not be repeated.

Note that, in each drawing referred to in the following description, sizes of some constituent members may be expressed exaggeratedly, in some cases, for convenience of description. Accordingly, relative sizes of constituent members illustrated in the drawings do not necessarily accurately express size relations between actual constituent members. In addition, in the following description, a stacked direction of a substrate and layers is expressed by a vertical direction, and a substrate side is defined as a lower side.

Note that description will be given in the following order.
1. First Embodiment (Example of Planar Type MOSFET)
   1.1. Structure of Planar Type MOSFET
   1.2. Process Flow of Planar Type MOSFET
   1.3. Modification Example of Planar Type MOSFET
2. Second Embodiment (Example of Fin type MOSFET)
   2.1. Structure of Fin Type MOSFET
   2.2. Process Flow of Fin Type MOSFET
   2.3. Modification of Fin Type MOSFET

1. First Embodiment

1.1. Structure of Planar Type MOSFET

First, with reference to FIG. 1, a configuration of a semiconductor device according to a first embodiment of the present disclosure will be described.

Figure 1:
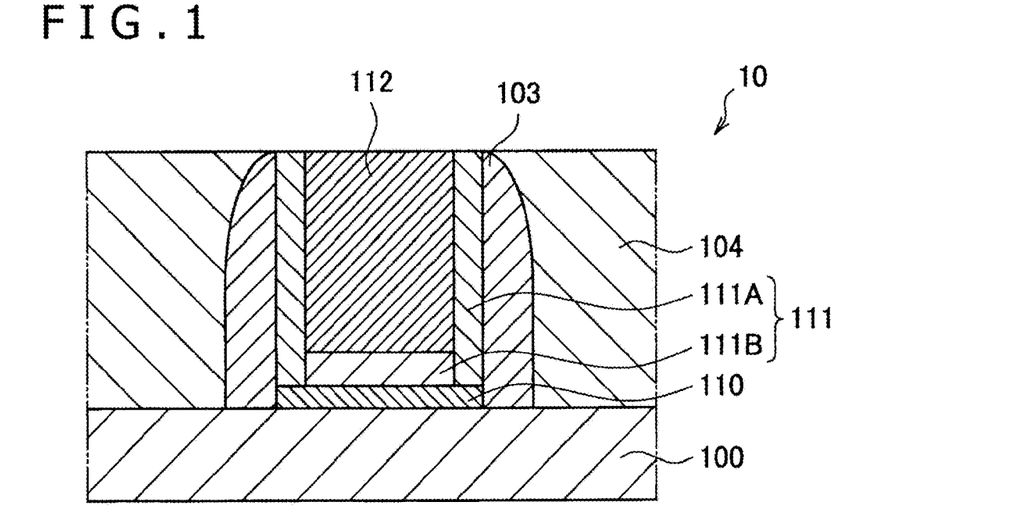
FIG. 1 is a cross-sectional view of a semiconductor device according to a first embodiment of the present disclosure.

As illustrated in FIG. 1, a first gate insulating film 110 and a second gate insulating film 111 are formed over a semiconductor substrate 100. The second gate insulating film 111 includes a first portion 111A and a second portion 111B. A gate electrode 112 is formed over the first insulating film 110 and the second gate insulating film 111. In addition, A sidewall insulating film 103 and an interlayer insulating film 104 are formed on both sides of the gate insulating film 111. Specifically, a semiconductor device 10 is a planar type MOSFET. Note that, in FIG. 1, a source electrode and a drain electrode are omitted for illustration.

In the configuration described above, at least the second portion 111B of the second gate insulating film 111 is a dielectric film having an additive such as cation species.

The semiconductor substrate 100 includes a semiconductor material and has a source region, a drain region, and a channel portion formed therein. Specifically, the channel portion is formed in the semiconductor substrate 100 below the first gate insulating film 110 and the second gate insulating film 111, and the source region and the drain region are each formed on either side of the channel portion in the semiconductor substrate 100. The semiconductor substrate 100 may be a polycrystalline, a single-crystal, or amorphous silicon (Si) substrate. Alternatively, the semiconductor substrate 100 may be a generally-called SOI (Silicon On Insulator) substrate in which an insulating film such as $SiO_2$ is interposed inside the silicon substrate described above. Moreover, the semiconductor substrate 100 may be a compound semiconductor substrate such as gallium arsenide (GaAs), a gallium nitride (GaN) substrate, or other kind of semiconductor substrate such as a silicon carbide (SiC) substrate, and may be a substrate obtained by forming a silicon (Si) film or the like over a substrate formed by using sapphire or other materials than a semiconductor.

The first gate insulating film 110 and the second gate insulating film 111 are sequentially provided over the semiconductor substrate 100 in this order. The first gate insulating film 110 and the second gate insulating film 111 may include an inorganic insulator and may include inorganic oxide or inorganic nitride. For example, the first gate insulating film 110 and the second gate insulating film 111 may include silicon oxide ($SiO_x$), silicon nitride ($SiN_x$), or silicon oxynitride (SiON), or the like, and may include hafnium oxide ($HfO_2$), aluminum hafnium oxide ($HfAlO_2$), silicon hafnium oxide (HfSiO), tantalum oxide ($Ta_2O_5$), aluminum oxide ($Al_2O_3$), zirconium oxide ($ZrO_2$), titanium oxide ($TiO_2$), or the like. The first gate insulating film 110 and the second gate insulating film 111 may include the same material or may include materials different from each other. The first gate insulating film 110 and the second gate insulating film 111 may be formed by depositing the inorganic oxides described above or the inorganic nitrides described above over the semiconductor substrate 100 and may be formed by oxidizing a front surface of the semiconductor substrate 100 to a predetermined depth.

Here, the second gate insulating film 111 may be provided over the first gate insulating film 110, being extended also over side surfaces of the gate electrode 112. Specifically, the second gate insulating film 111 may be provided so as to include the second portion 111B provided over the first gate insulating film 110, and the first portion 111A extended over the side surfaces of the gate electrode 112. With this configuration, the second gate insulating film 111 may be provided to have such a recess shape as to extend over a bottom surface and the side surfaces of the gate electrode 112.

The second gate insulating film 111 contains at least one of Si, Ge, Sn, Al, Ga, In, Sr, Sc, Y, La, Ti, Ce, Nb, Ta, and Gd which are cation species as an additive, and is provided such that a concentration of the cation species in the first portion 111A is different from a concentration of the cation species in the second portion 111B. For example, the second gate insulating film 111 may be provided such that the concentration of the cation species in the first portion 111A is lower than the concentration of the cation species in the second portion 111B. Since the dielectric film containing the cation species has a high dielectric constant, by lowering the concentration of the cation species in the dielectric film provided over the side surfaces of the gate electrode 112, it is possible to reduce a parasitic capacitance of the semiconductor device 10. Specifically, in the semiconductor device 10, the dielectric constant of the first portion 111A can be made lower than the dielectric constant of the second portion 111B, it is possible to reduce the parasitic capacitance formed on both sides of the gate electrode 112.

In addition, the concentration of the cation species in the second portion 111B may have a concentration gradient. Specifically, the concentration of the cation species in the second portion 111B may have a concentration gradient in a film thickness direction of the second gate insulating film 111.

For example, such second gate insulating film 111 described above can be formed by forming a film of inorganic oxide or inorganic nitride, doping the cation species through ion implantation to the formed film in a region corresponding to the second portion 111B, and then crystalizing the doped film through an annealing process. In the semiconductor device 10, by use of this formation method, it is possible to selectively dope the cation species to a predetermined portion of the second gate insulating film 111. In such a case described above, the first portion 111A of the second gate insulating film 111 may not contain any cation species.

In addition, the first gate insulating film 110 and the second gate insulating film 111 may each be provided by depositing a plurality of films over each of the first gate insulating film 110 and the second gate insulating film 111. Accordingly, the first gate insulating film 110 and the second gate insulating film 111 can control film characteristics more easily with accuracy.

A film thickness of the second gate insulating film 111 is preferably set to 2 nm or more and 30 nm or less. This is because, in a case in which the film thickness of the second gate insulating film 111 is less than 2 nm, the second gate insulating film 111 may not be formed as a film, possibly making it impossible to be crystalized. Moreover, This is because, in a case in which the film thickness of the second gate insulating film 111 is more than 30 nm, when ion implantation of the cation species is carried out, a depth of the ion implantation is not sufficient, whereby the cation species may not be distributed over the entire region of the film.

The gate electrode 112 is provided to include a conductive material on an opposite side of the semiconductor substrate 100 where the channel portion is formed, with the first gate insulating film 110 and a second gate insulating film 113 interposed between the gate electrode 112 and the semiconductor substrate 100. The gate electrode 112 may be formed to include polysilicon or the like, for example, or may be formed to include a metal, an alloy, or a metal compound such as titanium (Ti), molybdenum (Mo), tantalum (Ta), tungsten (W), niobium (Nb), nickel (Ni), zirconium (Zr), gold (Au), silver (Ag), aluminum (Al), copper (Cu), titanium nitride (TiN), tantalum nitride (TaN), titanium aluminum (TiAl), titanium silicon (TiSi), nickel silicon (NiSi), hafnium (Hf), hafniumsilicon (HfSi), tungsten (W), tantalum silicon (TaSi), tantalum silicon nitride (TaSiN), cobalt (Co), cobalt silicon (CoSi), ruthenium (Ru), or indium (In). Alternatively, the gate electrode 112 may be formed in a multilayer structure in which a plurality of layers including the above-described materials is stacked. With such a multilayer structure, the gate electrode 112 can reduce a wiring resistance or the like or control a work function with more accuracy.

The sidewall insulating film 103 is provided on each side of the gate electrode 112 with the first portion 111A of the second gate insulating film 111 interposed between the sidewall insulating film 103 and the gate electrode 112. Accordingly, the first portion 111A only may be provided being sandwiched between the sidewall insulating film 103 and the gate electrode 112. The sidewall insulating film 103 can include an insulating material, and for example, may include a silicon nitride film, a silicon oxide film, a TEOS film (that is, a silicon oxide film obtained by using tetraethylorthosilicate as a source gas), or the like.

The interlayer insulating film 104 includes an insulating material and is formed on side surfaces of the sidewall insulating film 103 on an opposite side to the side where the gate electrode 112 is provided. The interlayer insulating film 104 may include a silicon nitride film, a silicon oxide film, a TEOS film (that is, a silicon oxide film obtained by using tetraethylorthosilicate as a source gas), or the like.

Figure 7:
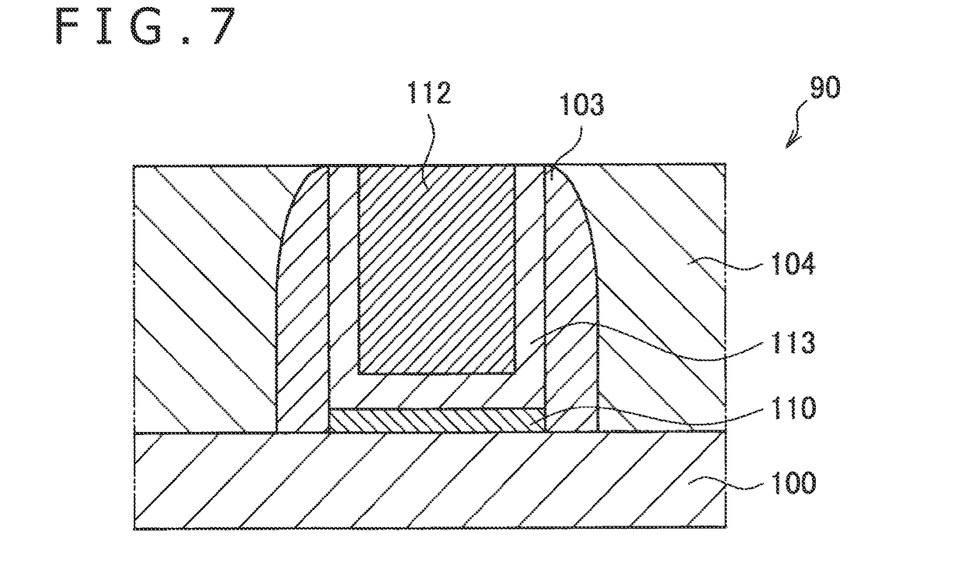
FIG. 7 is a cross-sectional view of a semiconductor device according to a related technique of the present disclosure.

Next, with reference to FIG. 7, a configuration of a semiconductor device 90 according to a comparative example will be described.

The semiconductor device 90 according to the comparative example is different from the semiconductor device 10 in a configuration of the second gate insulating film 113 corresponding to the second gate insulating film 111 in the semiconductor device 10. Specifically, in the semiconductor device 90 according to the comparative example, the second gate insulating film 113 entirely contains an additive such as cation species. Accordingly, in the semiconductor device 90 according to the comparative example, the second gate insulating film 113 formed by extending over side walls of the gate electrode 112 also contains cation species having a concentration of the substantially same extent as the second gate insulating film 113 formed on a bottom surface of the gate electrode 112. This is because, in the semiconductor device 90 according to the comparative example, the second gate insulating film 113 is deposited by the atomic layer deposition (ALD), the chemical vapor deposition (CVD), physical vapor deposition (PVD) including sputtering and electron beam evaporation and formed on the entire surface of the device.

The dielectric film such as $HfO_2$ or $ZrO_2$ is normally in an amorphous phase (an "a" phase), and a crystal structure of the dielectric film is further turned into a monoclinic crystal (an "m" phase) when the dielectric film is subjected to annealing in a temperature range of substantially 1000° C. or lower to be used in the semiconductor device manufacturing process. However, when the dielectric film such as $HfO_2$ or $ZrO_2$ is subjected to annealing after being intentionally doped with other elements such as cation species, the dielectric film such as $HfO_2$ or $ZrO_2$ may have such a crystal structure as a cubic crystal (a "c" phase), a tetragonal crystal (a "t" phase), or a orthorhombic crystal (an "o" phase), in some cases. Since these "c" phase, "t" phase, and "o" phase are higher in dielectric constant than the "a" phase and the "m" phase, the dielectric film having such a crystal structure formed on the side surfaces of the gate electrode 112 in the semiconductor device 90 according to the comparative example causes increase in parasitic capacitance. In contrast, in the semiconductor device according to the present embodiment, formation of the dielectric film having such a crystal structure on the side surfaces of the gate electrode 112 can be prevented, and accordingly, increase in parasitic capacitance can be prevented.

1.2. Process Flow of Planar Type MOSFET

Next, with reference to FIG. 2A to FIG. 2I, a manufacturing method of the semiconductor device according to the first embodiment of the present disclosure will be described.

Figure 2A:
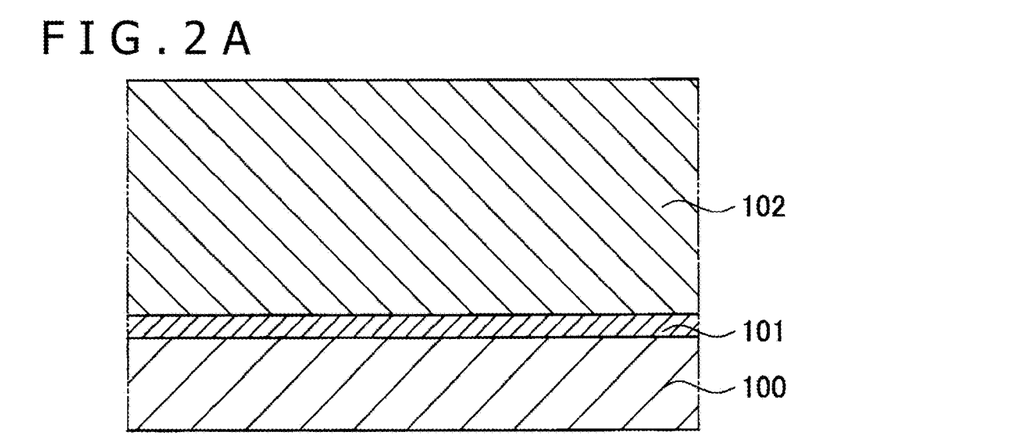
FIG. 2A is a cross-sectional view illustrating a manufacturing process in a manufacturing method of the semiconductor device according to the first embodiment.

First, as depicted in FIG. 2A, for example, a dummy insulating film 101 is formed over the semiconductor substrate 100 including silicon, and further, a dummy electrode 102 is formed over the dummy insulating film 101. Note that, in the semiconductor device 10 according to the present embodiment, the dummy insulating film 101 and the dummy electrode 102 are removed in the later process. The dummy insulating film 101 and the dummy electrode 102 may be simultaneously formed with a gate insulating film and a gate electrode in another field effect transistor which is simultaneously formed with the semiconductor device 10 over the semiconductor substrate 100.

Figure 2B:
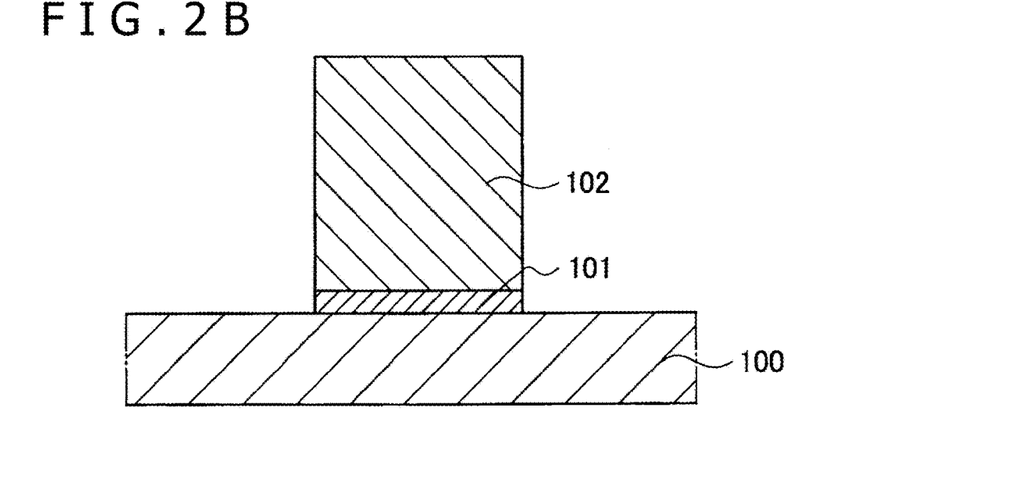
FIG. 2B is a cross-sectional view illustrating the manufacturing process in the manufacturing method of the semiconductor device according to the first embodiment.

Next, as depicted in FIG. 2B, dry etching or the like is carried out with a resist patterned by a photolithography technique or an electron beam lithography technique as a mask, and accordingly, the dummy insulating film 101 and the dummy electrode 102 are patterned.

Figure 2C:
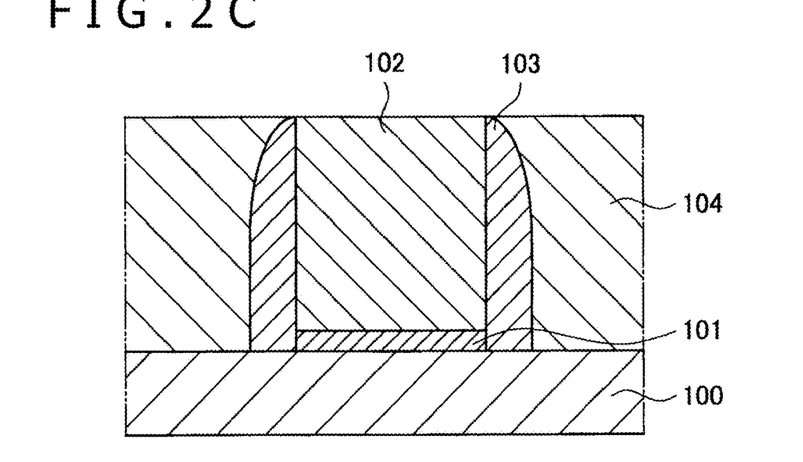
FIG. 2C is a cross-sectional view illustrating the manufacturing process in the manufacturing method of the semiconductor device according to the first embodiment.

Next, as depicted in FIG. 2C, after an insulating film is formed over the whole surface of the semiconductor substrate 100, the insulating film is subjected to dry etching or the like, and a sidewall insulating film 103 is formed on only sidewall portions of the dummy insulating film 101 and dummy electrode 102. The sidewall insulating film 103 can be formed by, for example, after a silicon nitride film, a silicon oxide film, a TEOS film, or the like is formed by the CVD technique or the like, etching the whole surface by the dry etching technique or the like. Next, for example, an interlayer insulating film 104 is formed over the whole surface of the semiconductor substrate 100 by the CVD technique. As the interlayer insulating film 104, for example, a TEOS film or the like can be used. Next, part of the interlayer insulating film 104 is removed such that an upper surface portion of the dummy electrode 102 is exposed. For example, by a CMP (Chemical Mechanical Polishing) technique, part of the interlayer insulating film 104 is polished to be removed.

Figure 2D:
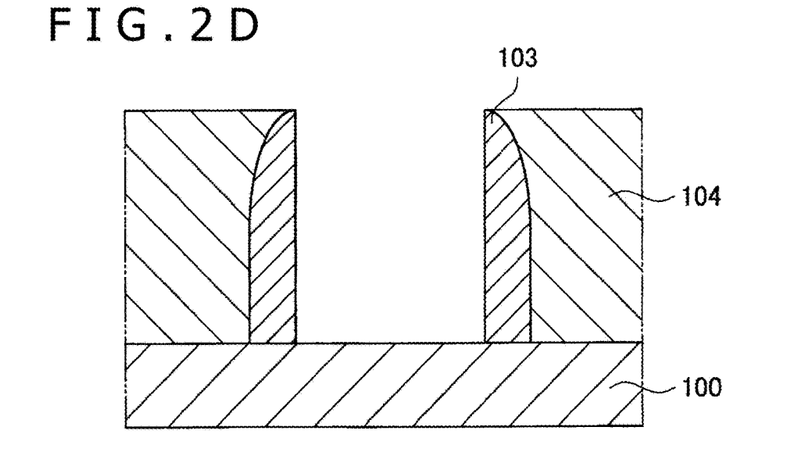
FIG. 2D is a cross-sectional view illustrating the manufacturing process in the manufacturing method of the semiconductor device according to the first embodiment.

Next, as depicted in FIG. 2D, the dummy electrode 102 and the dummy insulating film 101 are removed. The dummy electrode 102 can be selectively removed by, for example, using the dry etching technique. In addition, the dummy insulating film 101 can be selectively removed by, for example, using the dry etching technique or wet etching technique.

Figure 2E:
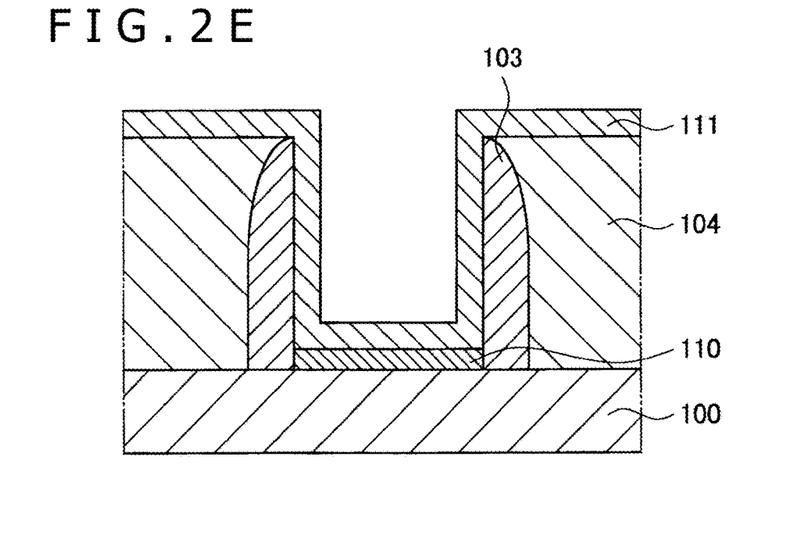
FIG. 2E is a cross-sectional view illustrating the manufacturing process in the manufacturing method of the semiconductor device according to the first embodiment.

Next, as depicted in FIG. 2E, a first gate insulating film 110 and a second gate insulating film 111 are deposited over the whole surface of the semiconductor substrate 100. Here, the first gate insulating film 110 may include, for example, silicon oxide ($SiO_x$), silicon nitride ($SiN_x$), silicon oxynitride (SiON), or the like. In addition, the second gate insulating film 111 may include, for example, hafnium oxide ($HfO_2$), zirconium oxide ($ZrO_2$), or the like. The first gate insulating film 110 and the second gate insulating film 111 may be formed by oxidizing from the front surface of the semiconductor substrate 100 to a predetermined depth or may be formed over the semiconductor substrate 100 by oxidizing the inorganic oxide or the inorganic nitride described above by using the ALD technique, the CVD technique, or the like.

Figure 2F:
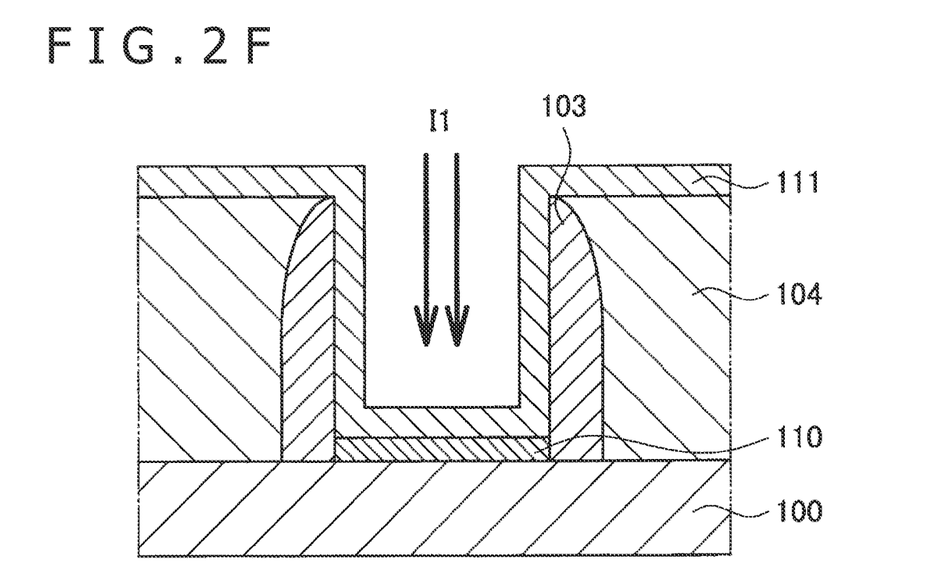
FIG. 2F is a cross-sectional view illustrating the manufacturing process in the manufacturing method of the semiconductor device according to the first embodiment.

Next, as depicted in FIG. 2F, for example, through an ion implantation technique I1, the cation species such as Si, Ge, Sn, Al, Ga, In, Sr, Sc, Y, La, Ti, Ce, Nb, Ta, or Gd is doped into the second gate insulating film 111. At this time, since ion implantation is carried out with respect to the substrate in a vertical direction, the cation species is not implanted into side surfaces of the second gate insulating film 111, and a concentration of the cation species of each of a sidewall portion and a bottom portion of the second gate insulating film 111 can be changed in a self-aligned manner. In addition, using a mask as needed, a predetermined region only can also be subjected to ion implantation.

Figure 2G:
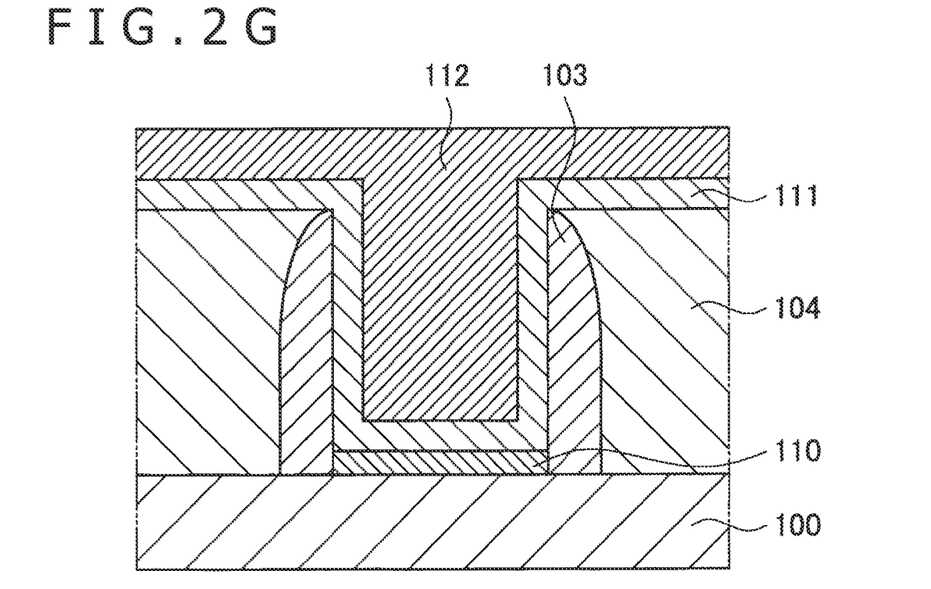
FIG. 2G is a cross-sectional view illustrating the manufacturing process in the manufacturing method of the semiconductor device according to the first embodiment.

Next, as depicted in FIG. 2G, a gate electrode 112 is deposited over the whole surface of the second gate insulating film 111 by the CVD technique, the ALD technique, the PVD technique, or the like. Here, the gate electrode 112 may be formed to include, for example, a metal, an alloy, or a metal compound.

Figure 2H:
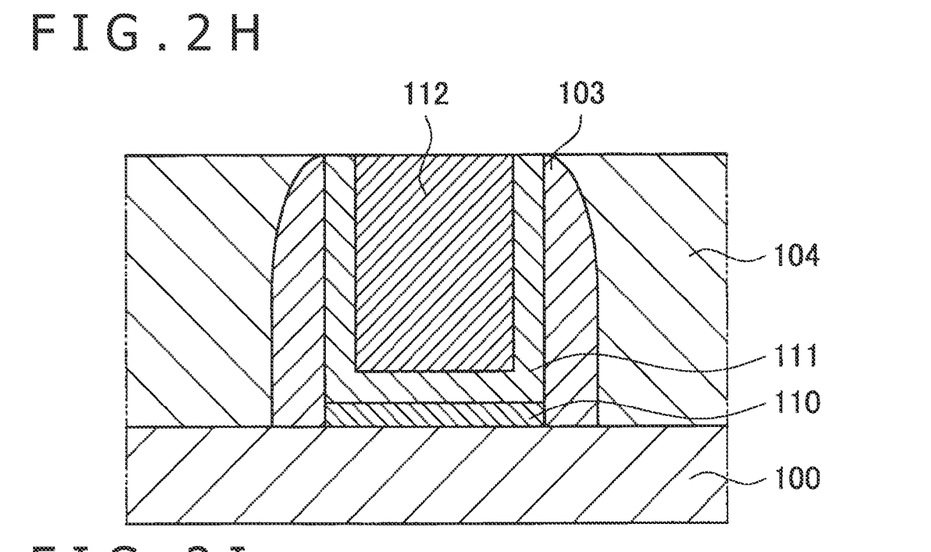
FIG. 2H is a cross-sectional view illustrating the manufacturing process in the manufacturing method of the semiconductor device according to the first embodiment.

Next, as depicted in FIG. 2H, the gate electrode 112 and the second gate insulating film 111 are removed such that an upper surface portion of the interlayer insulating film 104 is exposed. For example, by the CMP (Chemical Mechanical Polishing) technique, the gate electrode 112 and the second gate insulating film 111 are polished to be removed.

Figure 2I:
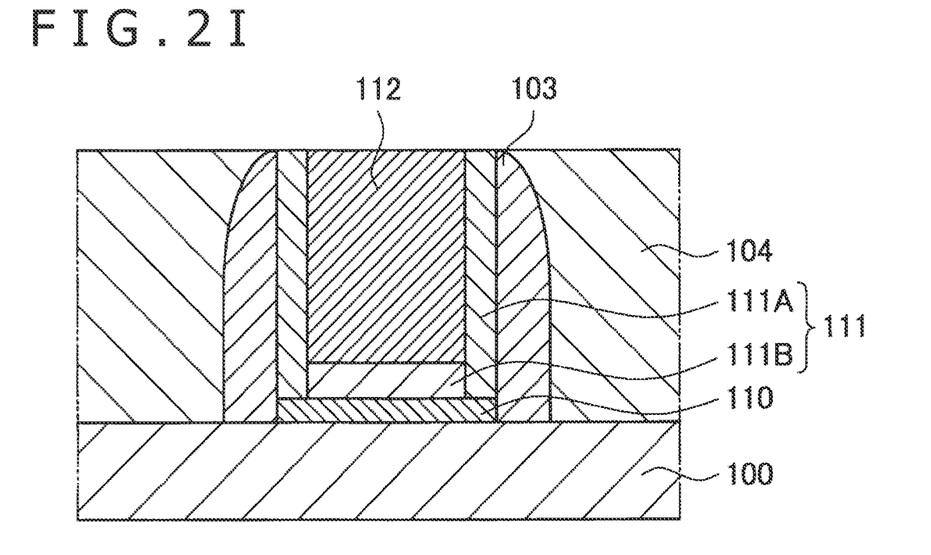
FIG. 2I is a cross-sectional view illustrating the manufacturing process in the manufacturing method of the semiconductor device according to the first embodiment.

Next, as depicted in FIG. 2I, the semiconductor device 10 is heated. As a result of the heating process, a second portion 111B of the second gate insulating film is crystalized, a crystal structure thereof is changed from the "a" phase, the "m" phase, or a mixed phase of these phases to the "c" phase, the "t" phase, the "o" phase, or a mixed phase of these phases. A dielectric constant of each of these "c" phase, "t" phase, and "o" phase is higher than a dielectric constant of the "a" phase or the "m" phase, and therefore, according to the manufacturing method of the semiconductor device of the present embodiment, it is possible to prevent the dielectric film having such a crystal structure from being formed over the side surfaces of the gate electrode 112 on sides of the source/drain regions, and it is possible to prevent increase in parasitic capacitance. Note that the heating process can be carried out in any order as long as it is carried out after the ion implantation I1.

1.3. Modification Example of Planar Type MOSFET

Figure 3:
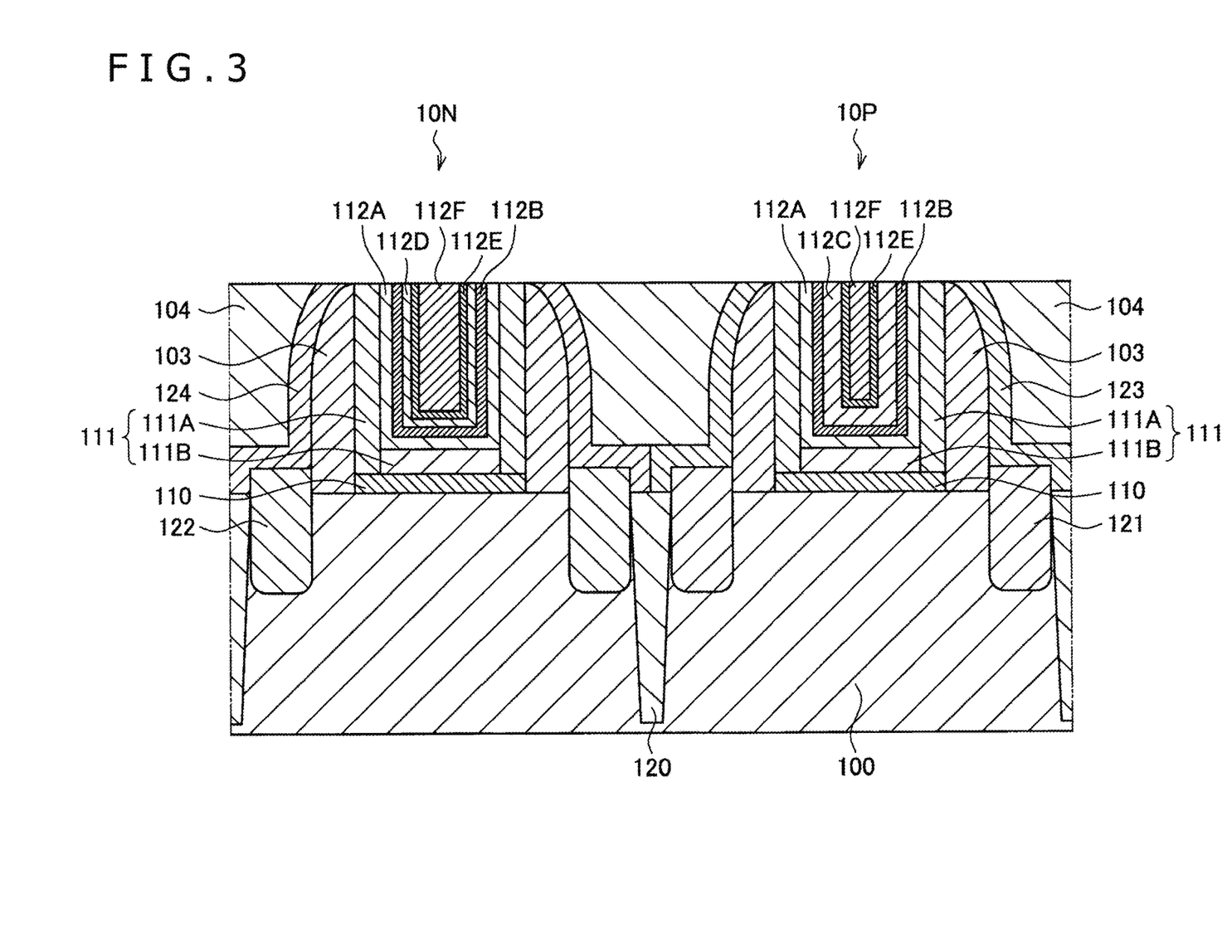
FIG. 3 is a cross-sectional view illustrating a modification example of the semiconductor device according to the first embodiment.

With reference to FIG. 3, a modification example of a configuration of the semiconductor device according to the first embodiment of the present disclosure will be described.

In the present modification example depicted in FIG. 3, a configuration of the semiconductor device in the present modification example is different from the configuration of the semiconductor device according to the first embodiment of the present disclosure in that the semiconductor device is a CMOS transistor including a N-type transistor 10N and a P-type transistor 10P. Specifically, in the present modification example, there are provided, in a stacked manner, an element isolation region 120 in which the N-type transistor 10N and P-type transistor 10P are isolated from each other, source/drain regions 121 and 122 formed in a material different from the semiconductor substrate 100, liner insulating layers 123 and 124 provided on a side opposite to the gate insulating film 111 with respect to the sidewall insulating film 103 disposed therebetween, a first metal layer 112A, a second metal layer 112B, a third metal layer 112C, a fourth metal layer 112D, a fifth metal layer 112E, and a sixth metal layer 112F which constitute a gate electrode. Note that the metal layers described above are merely an example, and the number of metal layers is not limited to those described above.

Note that, since configurations of the same components and the same reference signs among configurations depicted in FIG. 3 as the configurations depicted in FIG. 1 are substantially similar to those depicted in FIG. 1, a description is omitted here.

The element isolation region 120 may be formed in the semiconductor substrate 100, before the dummy insulating film 101 described above is formed. In addition, before the dummy insulating film 101 is formed, impurities are doped into the semiconductor substrate 100 by the ion implantation technique, so that a well region may be formed in the semiconductor substrate 100 in advance.

The source/drain regions 121 and 122 may be formed by selectively etching the semiconductor substrate 100 such that an etching selectivity of the sidewall insulating film 103 to the semiconductor substrate 100 is made higher. According to the selective etching described above, it is also possible to form a trench in the semiconductor substrate 100. Thereafter, the source/drain regions 121 and 122 may be selectively formed in an etched region in the semiconductor substrate 100. The source/drain region 121 can be formed by, for example, upon introducing a compression stress, depositing silicon germanium (SiGe), and the source/drain region 122 can be formed by, for example, upon introducing a tensile stress, depositing silicon carbide (SiC), through a selective epitaxial growth technique. Thus, the source/drain regions 121 and 122 allow the stresses to be applied to the channel portion, thereby enhancing the device characteristics.

The liner insulating layers 123 and 124 may be provided, for example, by forming a stress introducing layer over the whole surface of the substrate, by the CVD technique. The stress introducing layer can be formed by forming, for example, a silicon nitride film, as a film having a tensile stress or a compression stress depending on a type of channel. Accordingly, the liner insulating layers 123 and 124 can apply the stress to the channel portion, thereby enhancing the device characteristics.

The first metal layer 112A, the second metal layer 112B, the third metal layer 112C, the fourth metal layer 112D, the fifth metal layer 112E, and the sixth metal layer 112F may be formed by, for example, depositing a polysilicon layer, a metal layer, and a metal compound layer by the CVD technique, the ALD technique, or the PVD technique. With this configuration, the N-type transistor 10N or the P-type transistor 10P can each adjust threshold voltage and resistance value.

For example, the first metal layer 112A may include TiN, the second metal layer 112B may include TaN, the third metal layer 112C may include TiN, the fourth metal layer 112D may include TiN, the fifth metal layer 112E may include TiAl, the sixth metal layer 112F may include W.

In the foregoing description, the first embodiment of the present disclosure has been described in detail. Also, the technique according to the present disclosure can be applied also to a logic circuit device indicating an extremely sharp rising characteristic, such as a transistor or a memory, or a negative capacitance FET each of which uses a ferroelectric film.

2. Second Embodiment

2.1. Structure of Fin Type MOSFET

First, with reference to FIG. 4, a configuration of a semiconductor device according to a second embodiment of the present disclosure will be described. The semiconductor device according to the second embodiment of the present disclosure is, for example, a fin type MOSFET.

Figure 4:
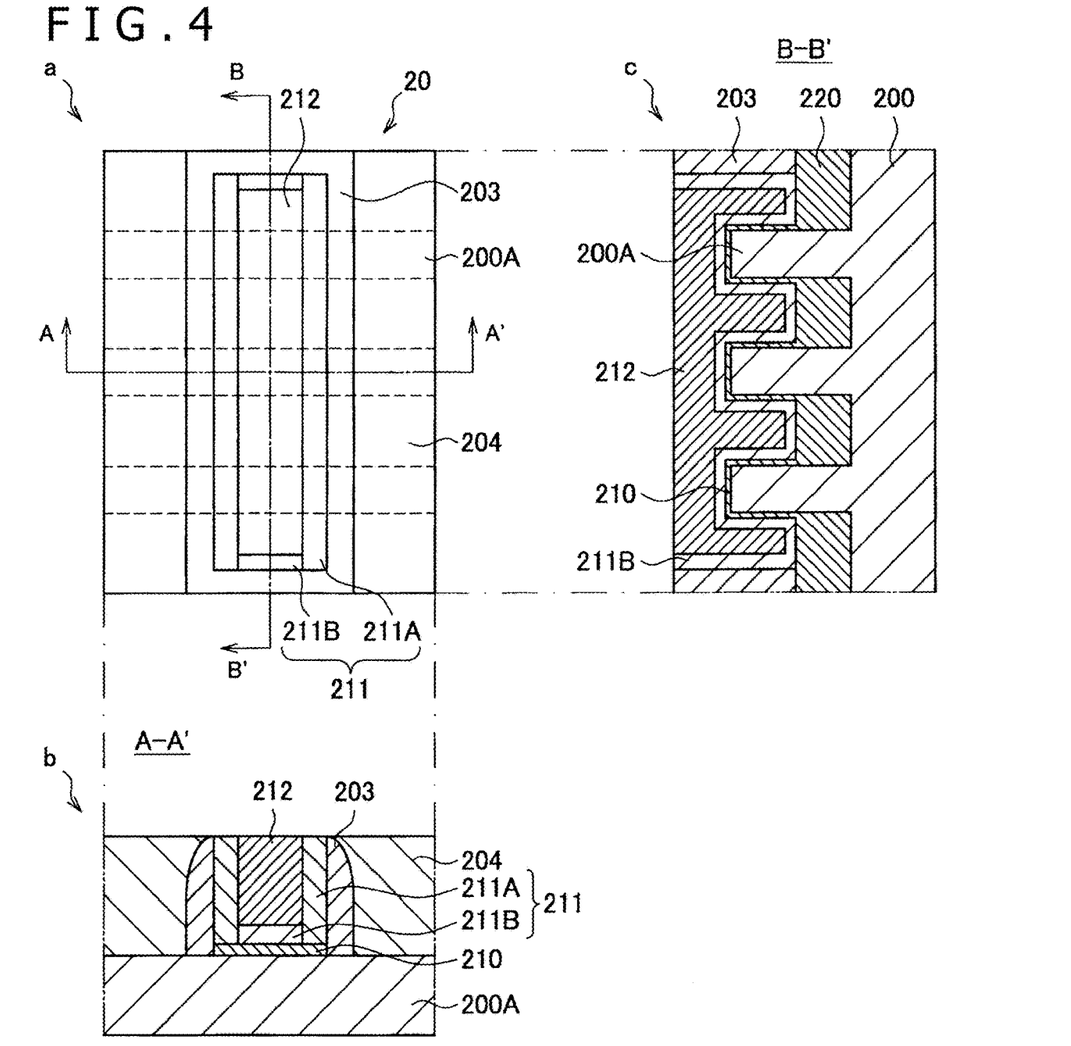
FIG. 4 depicts cross-sectional views of a semiconductor device according to a second embodiment of the present disclosure.

In FIG. 4, Subfigure "a" depicts a plan view of the fin type MOSFET, Subfigure "b" depicts a sectional view taken along A-A', and Subfigure "c" depicts a sectional view taken along B-B'. A structure of the fin type MOSFET is different from the structure of the planar type MOSFET in structure of the channel portion. Specifically, each of a plurality of a fin-shaped projecting portion 200A projected from the semiconductor substrate 200 has a channel portion, and the fin-shaped projecting portions 200A are isolated from each other by an element isolation 220. This fin type MOSFET has such a structure that the fin-shaped projecting portion 200A has the channel portion, so that a current amount per unit area can be increased.

As depicted in Subfigure "b," in the semiconductor device 20, a first gate insulating film 210 and a second gate insulating film 211 are formed over the projecting portion 200A, and the second gate insulating film 211 includes a first portion 211A and a second portion 211B. A gate electrode 212 is formed over the first gate insulating film 210 and the second gate insulating film 211. Moreover, a sidewall insulating film 203 and an interlayer insulating film 204 are formed on each side of the gate insulating film 211. In other words, the semiconductor device 20 is a fin type MOSFET. Note that, in Subfigure "b," a source electrode and a drain electrode are omitted for illustration.

Also, as depicted in Subfigure "c," the fin-shaped projecting portion 200A projecting from the semiconductor substrate 200 has the channel portion, and the fin-shaped projecting portions 200A are isolated from each other by the element isolation 220. Along a shape of the fin-shaped projecting portion 200A projecting from the semiconductor substrate 200, the first gate insulating film 210 is formed. In addition, a second portion 211B of the second gate insulating film 211 is provided extending along recesses and protrusions of the first gate insulating film 210, the element isolation 220, and the sidewall insulating film 203. Moreover, the gate electrode 212 is formed over the second portion 211B of the second gate insulating film 211.

In the configuration described above, of the second gate insulating film 211, at least the second portion 211B is a dielectric film having an additive such as cation species.

The projecting portion 200A includes a semiconductor material, and the projecting portion 200A has a source region, a drain region, and a channel portion formed therein. Specifically, the channel portion is formed in the projecting portion 200A below the first gate insulating film 210 and the second gate insulating film 211, and a source region and a drain region are each formed on either side of the channel portion of the projecting portion 200A. The projecting portion 200A may be formed by processing one main surface of the semiconductor substrate 200. Note that the semiconductor substrate 200 may be, for example, a polycrystalline, single crystal, or amorphous silicon (Si) substrate. In addition, the semiconductor substrate 200 may be a generally-called SOI (Silicon On Insulator) substrate in which an insulating film such as $SiO_2$ is interposed inside the silicon substrate described above. Moreover, the semiconductor substrate 200 may be a compound semiconductor substrate such as gallium arsenide (GaAs), a gallium nitride (GaN) substrate, or other kind of semiconductor substrate such as a silicon carbide (SiC) substrate, and may be a substrate obtained by forming a silicon (Si) film or the like over a substrate formed by using sapphire or other materials than a semiconductor.

The first gate insulating film 210 and the second gate insulating film 211 are sequentially provided over the projecting portion 200A in this order. The first gate insulating film 210 and the second gate insulating film 211 may include an inorganic insulator and may include an inorganic oxide or an inorganic nitride. For example, the first gate insulating film 210 and the second gate insulating film 211 may include silicon oxide ($SiO_x$), silicon nitride ($SiN_x$), or silicon oxynitride (SiON), or the like, and may include hafnium oxide ($HfO_2$), aluminum hafnium oxide ($HfAlO_2$), silicon hafnium oxide (HfSiO), tantalum oxide ($Ta_2O_5$), aluminum oxide ($Al_2O_3$), zirconium oxide ($ZrO_2$), titanium oxide ($TiO_2$), or the like. The first gate insulating film 210 and the second gate insulating film 211 may include the same material or may include materials different from each other. The first gate insulating film 210 and the second gate insulating film 211 may be formed by depositing the inorganic oxides described above or the inorganic nitrides described above over the semiconductor substrate 200 and may be formed by oxidizing a front surface of the semiconductor substrate 200 at a predetermined depth.

Here, the second gate insulating film 211 may be provided over the first insulating film 210, being extended also over side surfaces of the gate electrode 212. Specifically, the second gate insulating film 211 may be provided so as to include the second portion 211B provided over the first gate insulating film 210, and the first portion 211A extended over the side surfaces of the gate electrode 212. With this configuration, the second gate insulating film 211 may be provided to have such a recess shape as to extend over a bottom surface and the side surfaces of the gate electrode 212.

The second gate insulating film 211 includes at least one of Si, Ge, Sn, Al, Ga, In, Sr, Sc, Y, La, Ti, Ce, Nb, Ta, and Gd which are cation species as an additive, and is provided such that a concentration of the cation species in the first portion 211A is different from a concentration of the cation species in the second portion 211B. For example, the second gate insulating film 211 may be provided such that the concentration of the cation species in the first portion 211A is lower than the concentration of the cation species in the second portion 211B. Since the dielectric film containing the cation species has a high dielectric constant, by lowering the concentration of the cation species in the dielectric film provided over the side surfaces of the gate electrode 212, it is possible to reduce a parasitic capacitance of the semiconductor device 20. Specifically, in the semiconductor device 20, the dielectric constant of the first portion 211A can be made lower than the dielectric constant of the second portion 211B, it is possible to reduce the parasitic capacitance formed on both sides of the gate electrode 212.

In addition, the concentration of the cation species in the second portion 211B may have a concentration gradient. Specifically, the concentration of the cation species in the second portion 211B may have a concentration gradient in a film thickness direction of the second gate insulating film 211.

For example, such a second gate insulating film 211 described above can be formed by forming a film of inorganic oxide or inorganic nitride, doping the cation species through ion implantation to the formed film in a region corresponding to the second portion 211B, and then crystalizing the doped film through an annealing process. In the semiconductor device 20, by use of this formation method, it is possible to selectively dope the cation species to a predetermined portion of the second gate insulating film 211. In such a case described above, the first portion 211A of the second gate insulating film 211 may not contain any cation species.

In addition, the first gate insulating film 210 and the second gate insulating film 211 may each be provided by depositing a plurality of films on each of the first gate insulating film 210 and the second gate insulating film 211. Accordingly, the first gate insulating film 210 and the second gate insulating film 211 can control film characteristics more easily with accuracy.

A film thickness of the second gate insulating film 211 is preferably set to 2 nm or more and 30 nm or less. This is because, in a case in which the film thickness of the second gate insulating film 211 is less than 2 nm, the second gate insulating film 211 may not be formed as a film possibly making it impossible to be crystalized. Moreover, This is because, in a case in which the film thickness of the second gate insulating film 211 is more than 30 nm, when ion implantation of the cation species is carried out, a depth of the ion implantation is not sufficient, whereby the cation species may not be distributed over the entire area of the film.

The gate electrode 212 is provided to include a conductive material on an opposite side of the projecting portion 200A where the channel portion is formed, with the first gate insulating film 210 and a second gate insulating film 213 interposed between the gate electrode 212 and the projecting portion 200A. The gate electrode 212 may be formed to include polysilicon or the like, for example, or may be formed to include a metal, an alloy, or a metal compound such as titanium (Ti), molybdenum (Mo), tantalum (Ta), tungsten (W), niobium (Nb), nickel (Ni), zirconium (Zr), gold (Au), silver (Ag), aluminum (Al), copper (Cu), titanium nitride (TiN), tantalum nitride (TaN), titanium aluminum (TiAl), titanium silicon (TiSi), nickel silicon (NiSi), hafnium (Hf), hafnium silicon (HfSi), tungsten (W), tantalum silicon (TaSi), tantalum silicon nitride (TaSiN), cobalt (Co), cobalt silicon (CoSi), ruthenium (Ru), or indium (In). Alternatively, the gate electrode 112 may be formed in a multilayer structure in which a plurality of layers including the above-described materials is stacked. With such a multilayer structure, the gate electrode 112 can reduce a wiring resistance or the like or control a work function with more accuracy.

The sidewall insulating film 203 is provided on each side of the gate electrode 212 with the first portion 211A of the second gate insulating film 211 interposed between the sidewall insulating film 203 and the gate electrode 212. Accordingly, the first portion 211A only may be provided being sandwiched between the sidewall insulating film 203 and the gate electrode 212. The sidewall insulating film 203 can include an insulating material, and for example, may include a silicon nitride film, a silicon oxide film, a TEOS film, or the like.

The interlayer insulating film 204 includes an insulating material and is formed on side surfaces of the sidewall insulating film 203 on an opposite side to the side where the gate electrode 212 is provided. The interlayer insulating film 204 may include a silicon nitride film, a silicon oxide film, a TEOS film, or the like.

2.2. Process Flow of Fin Type MOSFET

Next, with reference to FIG. 5A to FIG. 5D, a manufacturing method of a semiconductor device according to a second embodiment of the present disclosure will be described. Note that, since a process flow of a sectional view of a fin type MOSFET taken along A-A' is similar to that of the planar type, a description thereof is omitted. In the following, a process flow of a sectional view of a fin type MOSFET taken along B-B' will be indicated.

Figure 5A:
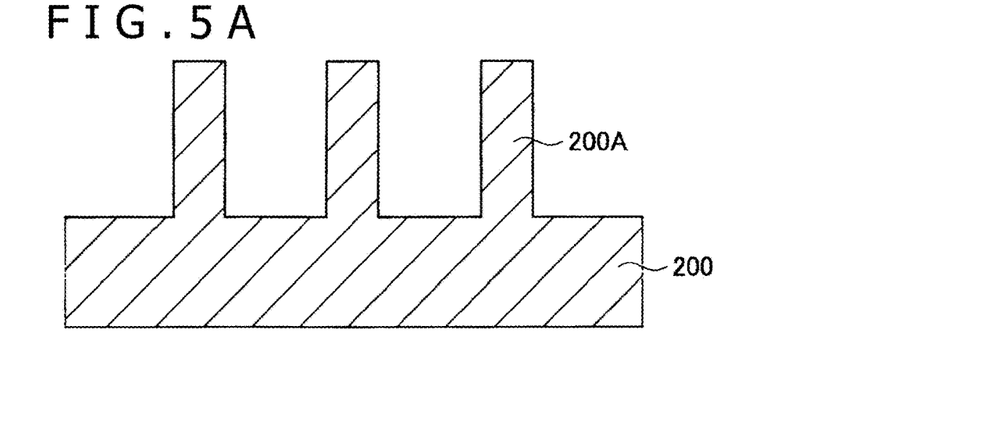
FIG. 5A is a cross-sectional view illustrating a manufacturing process in a manufacturing method of the semiconductor device according to the second embodiment.

First, as depicted in FIG. 5A, for example, etching such as dry etching is carried out using a hard mask and a resist film, as a mask, deposited over a semiconductor substrate 200 formed to include silicon. With this etching process, a projecting portion 200A in a fin shape which projects from the semiconductor substrate 200 is formed.

Figure 5B:
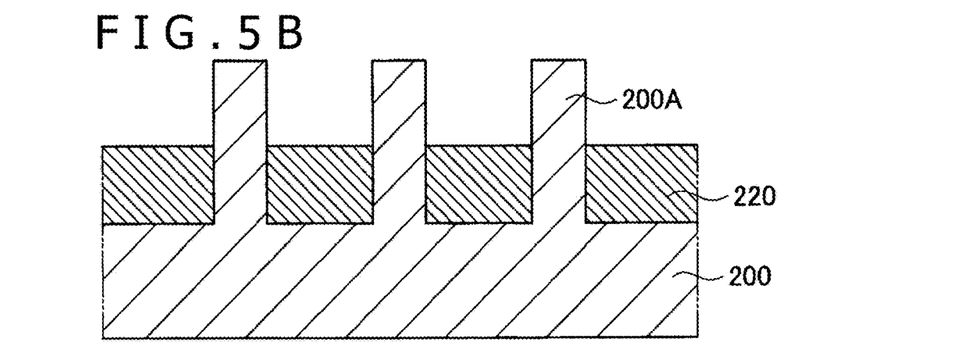
FIG. 5B is a cross-sectional view illustrating the manufacturing process in the manufacturing method of the semiconductor device according to the second embodiment.

Next, as depicted in FIG. 5B, for example, after a silicon oxide film or the like is formed through the CVD technique or the like, an element isolation 220 can be formed by etching the formed silicon oxide film or the like through the dry etching technique or the like.

Figure 5C:
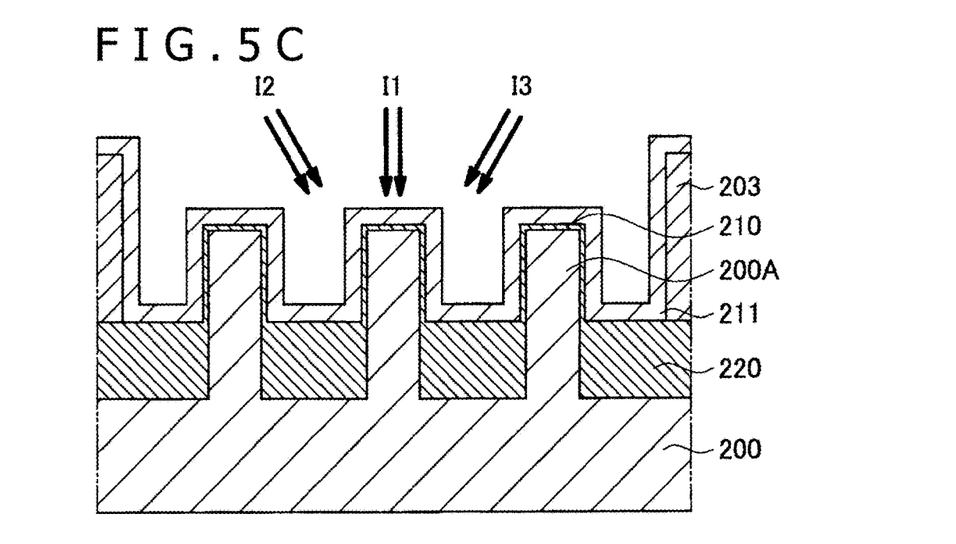
FIG. 5C is a cross-sectional view illustrating the manufacturing process in the manufacturing method of the semiconductor device according to the second embodiment.

Thereafter, through the processes in the planar type MOSFET corresponding to FIG. 2A to FIG. 2E, a first gate insulating film 210, a second gate insulating film 211, a sidewall insulating film 203, and an interlayer insulating film 204 (not depicted) are formed. Subsequently, as depicted in FIG. 5C, for example, through the ion implantation techniques I1, I2, and I3, cation species such as Si, Ge, Sn, Al, Ga, In, Sr, Sc, Y, La, Ti, Ce, Nb, Ta, or Gd is doped into the second gate insulating film 211. At this time, since cation species is doped also into sidewall portions of the second gate insulating film 211, ion implantation of the cation species is obliquely carried out at least twice. At this time, as needed, by using a mask material, it is also possible to carry out ion implantation only on a predetermined region.

Figure 5D:
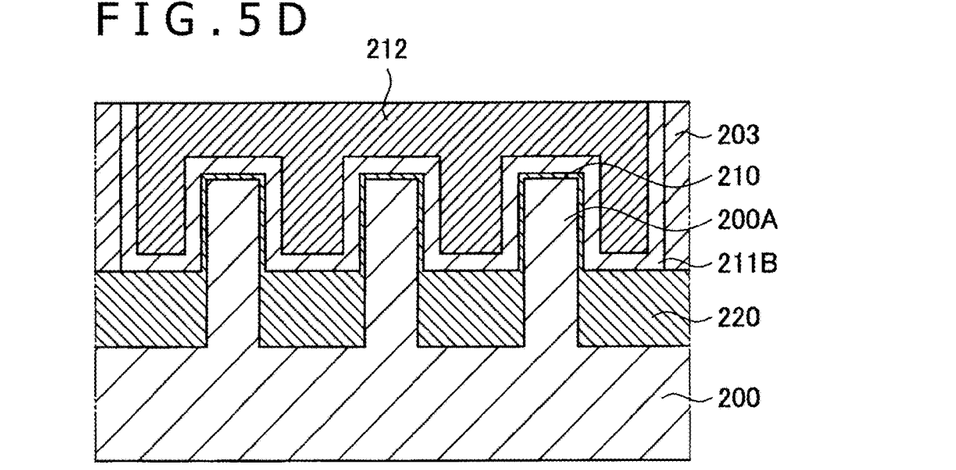
FIG. 5D is a cross-sectional view illustrating the manufacturing process in the manufacturing method of the semiconductor device according to the second embodiment.

Then, through the processes in the planar type MOSFET corresponding to FIG. 2G to FIG. 2H, a gate electrode 212 is formed over the second gate insulating film 211. Subsequently, as depicted in FIG. 5D, the semiconductor device 20 is subjected to a heating process. According to the heating process, the second portion 211B of the second gate insulating film doped with the cation species is crystalized, and a crystal structure of the second portion 211B is turned from the "a" phase, the "m" phase, or the mixed phase thereof to the "c" phase, the "t" phase, the "o" phase, or the mixed phase thereof. A dielectric constant of each of these "c" phase, "t" phase, and "o" phase is higher than a dielectric constant of each of the "a" phase and "m" phase. Thus, according to the manufacturing method of the semiconductor device of the present embodiment, it is possible to prevent formation of a dielectric film having such a crystal structure on side surfaces of the gate electrode 212 on sides of a source/drain regions, and to prevent an increase in parasitic capacitance. Note that the heating process can be carried out in any order as long as it is carried out after the ion implantation techniques I1, I2, and I3.

2.3. Modification Example of Fin Type MOSFET

Figure 6A:
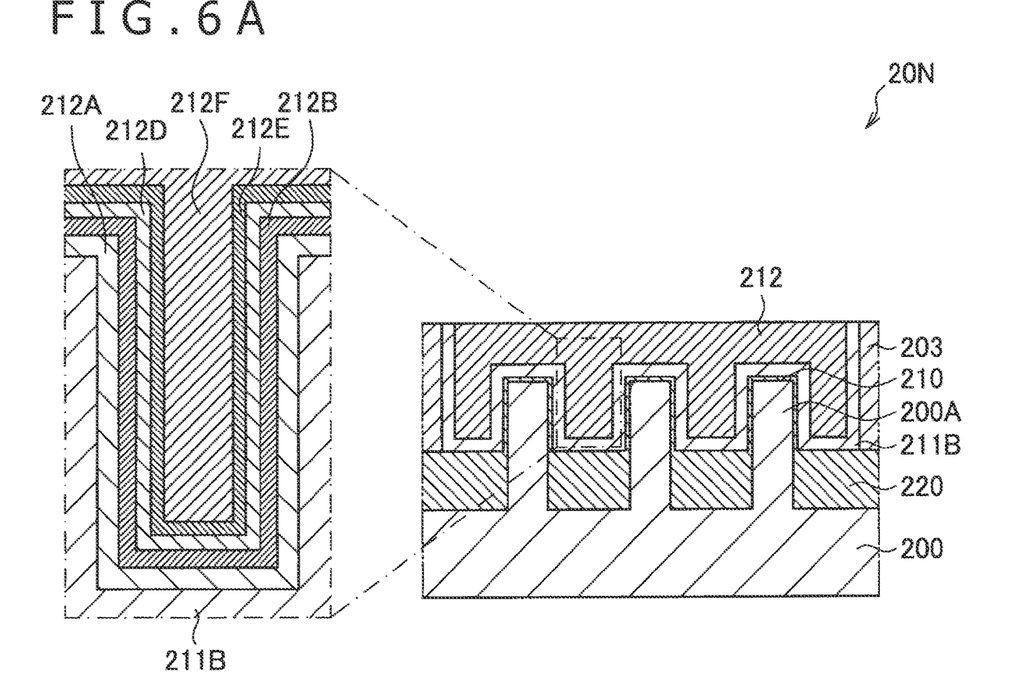
FIG. 6A is a cross-sectional view illustrating a modification example of the semiconductor device according to the second embodiment.
Figure 6B:
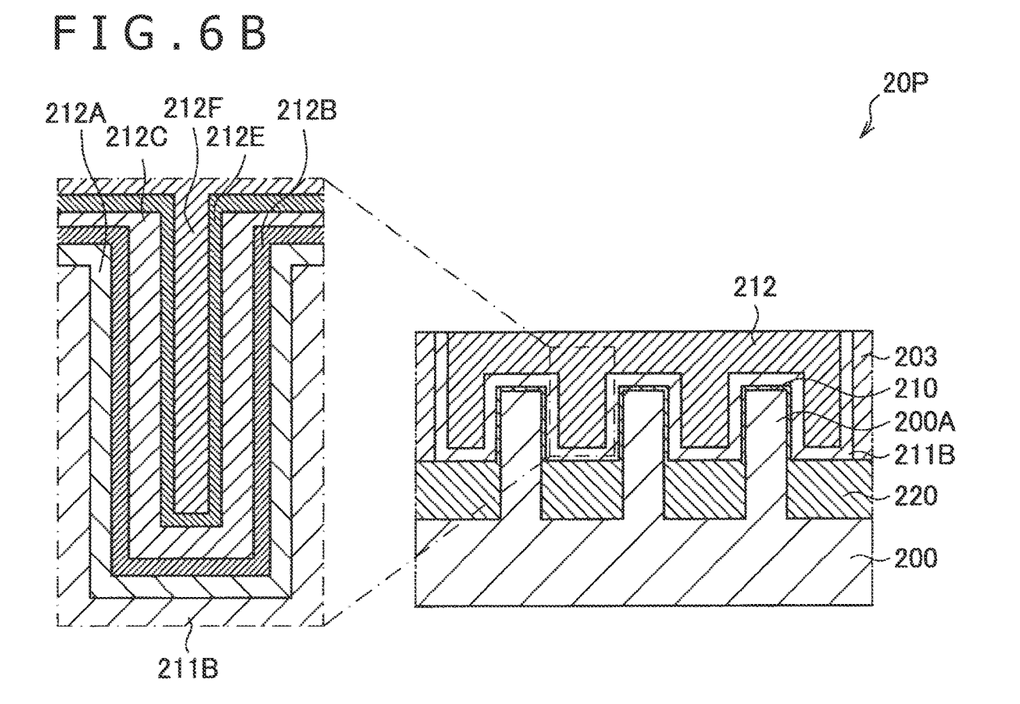
FIG. 6B is a cross-sectional view illustrating the modification example of the semiconductor device according to the second embodiment.

With reference to FIG. 6A and FIG. 6B, a modification example of the configuration of the semiconductor device according to the second embodiment of present disclosure will be described.

In the present modification example depicted in FIG. 6A and FIG. 6B, an N-type transistor 20N is depicted in FIG. 6A, and a P-type transistor 20P is depicted in FIG. 6B. The present modification example differs from a configuration of the semiconductor device according to the second embodiment of the present disclosure in that a semiconductor device is a CMOS transistor including the N-type transistor 20N depicted in FIG. 6A and the P-type transistor 20P depicted in FIG. 6B. Specifically, in the present modification example, regarding the N-type transistor 20N, a first metal layer 212A, a second metal layer 212B, a fourth metal layer 212D, a fifth metal layer 212E, and a sixth metal layer 212F are provided in a stacked manner, thereby constituting a gate electrode, while, regarding the P-type transistor 20P, the first metal layer 212A, the second metal layer 212B, a third metal layer 212C, the fifth metal layer 212E, and the sixth metal layer 212F are provided in a stacked manner, thereby constituting the gate electrode. Note that a configuration of the metal layer is merely an example here, and the configuration of the metal layer is not limited to the description in this specification.

Note that, since configurations of the same components and the same reference signs among configurations depicted in FIG. 6A and FIG. 6B as the configurations depicted in FIG. 4 are substantially similar to those depicted in FIG. 4, a description is omitted here.

The first metal layer 212A, the second metal layer 212B, the third metal layer 212C, the fourth metal layer 212D, the fifth metal layer 212E, and the sixth metal layer 212F may be formed by depositing a polysilicon layer, a metal layer, or a metal compound layer, for example, through the CVD technique, the ALD technique, or the PVD technique. Thus, it is possible to adjust a threshold voltage or a resistance value of each of the N-type transistor 20N or the P-type transistor 20P.

For example, the first metal layer 212A may include TiN, the second metal layer 212B may include TaN, the third metal layer 212C may include TiN, the fourth metal layer 212D may include TiN, the fifth metal layer 212E may include TiAl, and the sixth metal layer 212F may include W.

In the foregoing, the second embodiment of the present disclosure has been described in detail. Moreover, the technique according to the present disclosure can be applied also to a logic circuit device indicating an extremely sharp rising characteristic, such as a transistor or a memory, or a negative capacitance FET each of which uses a ferroelectric film.

The preferred embodiment of the present disclosure is described in detail above with reference to the attached drawings, but the technical scope of the present disclosure is not limited to the example. It is apparent that various changes or modifications could be arrived at by persons who have ordinary knowledge in the technical field to which the present disclosure belongs within the scope of the technical idea described in the appended claims, and it is therefore understood that such changes or modifications naturally belong to the technical scope of the present disclosure.

Further, the effect described herein is merely illustrative and exemplary and is not limited. That is, the technique according to the present disclosure may provide other effects that are obvious for persons skilled in the art from the description of the present specification, in addition to the above-mentioned effect or instead of the above-mentioned effect.

Note that the following configurations also belong to the technical scope of the present disclosure.

(1)

A semiconductor device including:

a channel portion; and a gate electrode provided on a side opposite to the channel portion with a gate insulating film interposed between the gate electrode and the channel portion, in which the gate insulating film incudes a first portion having a first transition metal oxide, and a second portion having a second transition metal oxide and cation species and having a concentration of the cation species different from the first portion.

(2)

The semiconductor device according to (1) above, in which a transition metal element contained in the first transition metal oxide, and a transition metal element contained in the second transition metal oxide each include at least one of Hf and Zr.

(3)

The semiconductor device according to (1) or (2) above, in which the first transition metal oxide is identical to the second transition metal oxide.

(4)

The semiconductor device according to any one of (1) to (3) above, in which
a film thickness of the first portion and a film thickness of the second portion are 2 nm or more and 30 nm or less.

(5)

The semiconductor device according to any one of (1) to (4) above, in which
the cation species includes at least one of Si, Ge, Sn, Al, Ga, In, Sr, Sc, Y, La, Ti, Ce, Nb, Ta, and Gd.

(6)

The semiconductor device according to any one of (1) to (5) above, in which
the concentration of the cation species of the first portion is lower than the concentration of the cation species of the second portion.

(7)

The semiconductor device according to (6) above, in which the first portion does not include the cation species.

(8)

The semiconductor device according to any one of (1) to (7) above, in which
the cation species in the second portion has a concentration gradient.

(9)

The semiconductor device according to any one of (1) to (8) above, in which
a dielectric constant of the first portion is lower than a dielectric constant of the second portion.

(10)

The semiconductor device according to any one of (1) to (9) above, in which
the first portion is provided extended over side surfaces of the gate electrode.

(11)

The semiconductor device according to (10) above, further including:
a sidewall portion provided in contact with the gate insulating film, in which
the first portion only is sandwiched between the gate electrode and the sidewall portion (12)

The semiconductor device according to any one of (1) to (11) above, in which
the gate insulating film is provided such that a plurality of films is stacked on top of another.

(13)

The semiconductor device according to any one of (1) to (12) above, in which
the channel portion is provided in a semiconductor substrate.

(14)

The semiconductor device according to any one of (1) to (13) above, in which
the channel portion is provided in a semiconductor layer which is provided in a projecting manner.

(15)

A manufacturing method of a semiconductor device, including:
forming a channel portion; and
forming a gate electrode provided on a side opposite to the channel portion with a gate insulating film interposed between the gate electrode and the channel portion, in which
the gate insulating film is formed so as to include a first portion having a first transition metal oxide, and a second portion having a second transition metal oxide and cation species and having a concentration of the cation species different from the first portion.

(16)

The manufacturing method of a semiconductor device according to (15) above, in which
the cation species is doped through an ion implantation technique.

(17)

Electronic equipment including:
a channel portion; and
a gate electrode provided on a side opposite to the channel portion with a gate insulating film interposed between the gate electrode and the channel portion, in which the gate insulating film incudes a first portion having a first transition metal oxide, and a second portion having a second transition metal oxide and cation species and having a concentration of the cation species different from the first portion.

REFERENCE SIGNS LIST 10, 20, 90: Semiconductor device
10N, 20N: N-type transistor
10P, 20P: P-type transistor
100, 200: Semiconductor substrate
101: Dummy insulating film
102: Dummy electrode
103, 203: Sidewall insulating film
104, 204: Interlayer insulating film
110, 210: First gate insulating film
111, 113, 211, 213: Second gate insulating film
111A, 211A: First portion
111B, 211B: Second portion
112, 212: Gate electrode
112A, 212A: First metal layer
112B, 212B: Second metal layer
112C, 212C: Third metal layer
112D, 212D: Fourth metal layer
112E, 212E: Fifth metal layer
112F, 212F: Sixth metal layer
120, 220: Element isolation region
121 and 122: Source/drain region
123 and 124: Liner insulating layer
200A: Projecting portion

What is claimed is:

1. A semiconductor device, comprising:
a channel portion; and
a gate electrode provided on a side opposite to the channel portion with a gate insulating film interposed between the gate electrode and the channel portion,
wherein the gate insulating film incudes a first portion having a first transition metal oxide, and a second portion having a second transition metal oxide and cation species and having a concentration of the cation species different from the first portion, and
wherein the first portion does not include the cation species.

2. The semiconductor device according to claim 1, wherein a transition metal element contained in the first transition metal oxide, and a transition metal element contained in the second transition metal oxide each include at least one of Hf and Zr.

3. The semiconductor device according to claim 1, wherein the first transition metal oxide is identical to the second transition metal oxide.

4. The semiconductor device according to claim 1, wherein a film thickness of the first portion and a film thickness of the second portion are 2 nm or more and 30 nm or less.

5. The semiconductor device according to claim 1, wherein the cation species includes at least one of Si, Ge, Sn, Al, Ga, In, Sr, Sc, Y, La, Ti, Ce, Nb, Ta, and Gd.

6. The semiconductor device according to claim 1, wherein the cation species in the second portion has a concentration gradient.

7. The semiconductor device according to claim 1, wherein a dielectric constant of the first portion is lower than a dielectric constant of the second portion.

8. The semiconductor device according to claim 1, wherein the first portion is provided extending over side surfaces of the gate electrode.

9. The semiconductor device according to claim 8, further comprising:
 a sidewall portion provided in contact with the gate insulating film,
 wherein the first portion only is sandwiched between the gate electrode and the sidewall portion.

10. The semiconductor device according to claim 1, wherein the gate insulating film is provided such that a plurality of films is stacked on top of another.

11. The semiconductor device according to claim 1, wherein the channel portion is provided in a semiconductor substrate.

12. The semiconductor device according to claim 1, wherein the channel portion is provided in a semiconductor layer which is provided in a projecting manner.

13. A manufacturing method of a semiconductor device, comprising:
 forming a channel portion; and
 forming a gate electrode provided on a side opposite to the channel portion with a gate insulating film interposed between the gate electrode and the channel portion,
 wherein the gate insulating film is formed so as to include a first portion having a first transition metal oxide, and a second portion having a second transition metal oxide and cation species and having a concentration of the cation species different from the first portion, and
 wherein the first portion does not include the cation species.

14. The manufacturing method of a semiconductor device according to claim 13, wherein the cation species is doped through an ion implantation technique.

15. Electronic equipment comprising:
 a channel portion; and
 a gate electrode provided on a side opposite to the channel portion with a gate insulating film interposed between the gate electrode and the channel portion,
 wherein the gate insulating film incudes a first portion having a first transition metal oxide, and a second portion having a second transition metal oxide and cation species and having a concentration of the cation species different from the first portion, and
 wherein the first portion does not include the cation species.

16. The electronic equipment according to claim 15, wherein a transition metal element contained in the first transition metal oxide, and a transition metal element contained in the second transition metal oxide each include at least one of Hf and Zr.

17. The electronic equipment according to claim 15, wherein the first transition metal oxide is identical to the second transition metal oxide.

18. The electronic equipment according to claim 15, wherein a film thickness of the first portion and a film thickness of the second portion are 2 nm or more and 30 nm or less.

19. The electronic equipment according to claim 15, wherein the cation species includes at least one of Si, Ge, Sn, Al, Ga, In, Sr, Sc, Y, La, Ti, Ce, Nb, Ta, and Gd.

20. The electronic equipment according to claim 15, wherein the cation species in the second portion has a concentration gradient.

* * * * *